United States Patent
Uehara et al.

(10) Patent No.: US 12,557,549 B2
(45) Date of Patent: Feb. 17, 2026

(54) THERMOELECTRIC CONVERSION ELEMENT AND THERMOELECTRIC CONVERSION MODULE

(71) Applicant: Panasonic Intellectual Property Management Co., Ltd., Osaka (JP)

(72) Inventors: Miho Uehara, Osaka (JP); Yuriko Kaneko, Nara (JP); Atsushi Ono, Kyoto (JP); Masashige Kawabe, Kyoto (JP); Tsutomu Kanno, Kyoto (JP); Hiromasa Tamaki, Osaka (JP); Hiroki Sato, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 18/524,965

(22) Filed: Nov. 30, 2023

(65) Prior Publication Data

US 2024/0099139 A1     Mar. 21, 2024

Related U.S. Application Data

(63) Continuation of application No. 16/417,791, filed on May 21, 2019, now Pat. No. 11,871,666, which is a
(Continued)

(30) Foreign Application Priority Data

Jun. 27, 2018     (JP) ................................. 2018-122095

(51) Int. Cl.
*H10N 10/01*     (2023.01)
*H10N 10/17*     (2023.01)
(Continued)

(52) U.S. Cl.
CPC .............. *H10N 10/01* (2023.02); *H10N 10/17* (2023.02); *H10N 10/81* (2023.02); *H10N 10/817* (2023.02); *H10N 10/852* (2023.02)

(58) Field of Classification Search
None
See application file for complete search history.

(56) References Cited

U.S. PATENT DOCUMENTS

| | | |
|---|---|---|
| 6,083,770 A | 7/2000 | Sato et al. |
| 2006/0118159 A1 | 6/2006 | Tsuneoka et al. |

(Continued)

FOREIGN PATENT DOCUMENTS

| | | | |
|---|---|---|---|
| JP | H09293906 A | * 11/1997 | ............. H01L 35/08 |
| JP | 2016-157843 A | 9/2016 | |
| WO | 2017/072982 A1 | 5/2017 | |

OTHER PUBLICATIONS

Machine translation of JPH09293906A (Year: 1997).*

(Continued)

*Primary Examiner* — Tamir Ayad
(74) *Attorney, Agent, or Firm* — Rimon P.C.

(57) ABSTRACT

A fabrication method of a thermoelectric conversion element includes forming a first metal layer containing Cu on a first surface of a thermoelectric conversion layer, and forming a first electrode and a first intermediate layer from the first metal layer. The thermoelectric conversion layer is composed of a thermoelectric conversion material containing Mg and at least one kind of element selected from the group consisting of Sb and Bi, the first intermediate layer is provided between the thermoelectric conversion layer and the first electrode, the first intermediate layer is in contact with the thermoelectric conversion layer, the first electrode is in contact with the first intermediate layer, and a composition of the first intermediate layer is different from both a
(Continued)

composition of the first electrode and a composition of the thermoelectric conversion layer.

6 Claims, 9 Drawing Sheets

Related U.S. Application Data continuation of application No. PCT/JP2018/041801, filed on Nov. 12, 2018.

(51) Int. Cl.
    *H10N 10/81*     (2023.01)
    *H10N 10/817*     (2023.01)
    *H10N 10/852*     (2023.01)

(56) References Cited

U.S. PATENT DOCUMENTS

| | | |
|---|---|---|
| 2013/0199593 A1 | 8/2013 | Higashida et al. |
| 2014/0216515 A1 | 8/2014 | Ochi et al. |
| 2017/0012191 A1* | 1/2017 | Uchiyama .............. H10N 10/01 |
| 2017/0117453 A1 | 4/2017 | Tamaki et al. |

OTHER PUBLICATIONS

Lanford, W.A. et al., "Alloying of copper for use in microelectronic metallization" Materials Chemistry and Physics, vol. 41, Issue 3, Aug. 1995, pp. 192-198 (Year: 1995).*
International Search Report of PCT application No. PCT/JP2018/041801 dated Jan. 29, 2019.
D. Kraemer et al., "High thermoelectric Conversion Efficiency of MgAgSb-based Material with Hot-Pressed Contacts", Energy & Environmental Science, 2015, 8, first published on Jan. 29, 2015, 1299-1308, <http://dx.doi.org/10.1039/C4EE02813A>.
Non-Final Office Action dated Dec. 8, 2020 issued in U.S. Appl. No. 16/417,791.
Final Office Action dated May 28, 2021 issued in U.S. Appl. No. 16/417,791.
Non-Final Office Action dated Oct. 4, 2021 issued in U.S. Appl. No. 16/417,791.
Final Office Action dated Mar. 2, 2022 issued in U.S. Appl. No. 16/417,791.
Non-Final Office Action dated Jul. 22, 2022 issued in U.S. Appl. No. 16/417,791.
Final Office Action dated Jan. 12, 2023 issued in U.S. Appl. No. 16/417,791.
Non-Final Office Action dated Apr. 25, 2023 issued in U.S. Appl. No. 16/417,791.
Notice of Allowance dated Aug. 30, 2023 issued in U.S. Appl. No. 16/417,791.

* cited by examiner

THERMOELECTRIC CONVERSION ELEMENT AND THERMOELECTRIC CONVERSION MODULE

CROSS-REFERENCE TO RELATED APPLICATIONS

This application is a Continuation of U.S. patent application Ser. No. 16/417,791, filed on May 21, 2019, which is a Continuation of International Patent Application No. PCT/JP2018/041801, filed on Nov. 12, 2018, which claims priority to Japanese Patent Application No. 2018-122095, filed on Jun. 27, 2018, the entire disclosures each of which are hereby incorporated by reference.

BACKGROUND

1. Technical Field

The present disclosure relates to a thermoelectric conversion element and thermoelectric conversion module.

2. Description of the Related Art

A thermoelectric conversion element composed of a thermoelectric conversion material and a pair of electrodes each of which has been joined to the thermoelectric conversion material is known. An n-type thermoelectric conversion element can be constituted with an n-type thermoelectric conversion material. A p-type thermoelectric conversion element can be constituted with a p-type thermoelectric conversion material. With a thermoelectric conversion module in which the n-type thermoelectric conversion element and the p-type thermoelectric conversion element are combined, electric power can be generated on the basis of a temperature difference generated by inflow of thermal energy.

Non-Patent Literature 1 discloses a thermoelectric conversion element composed of an MgAgSb-type thermoelectric conversion material and a pair of Ag electrodes each of which has been joined to the material.

Patent Literature 1 discloses an MgSbBiTe-type thermoelectric conversion material.

CITATION LIST

Patent Literature

Patent Literature 1: United States Patent Application Publication No. 2017/0117453 A1

Non-Patent Literature

Non-Patent Literature 1: D. Kraemer et. al., "High thermoelectric conversion efficiency of MgAgSb-based material with hot-pressed contacts", Energy Environ. Sci., 2015, 8, 1299-1308

SUMMARY

As electric resistance between a pair of electrodes in a thermoelectric conversion element is lower, thermoelectric conversion performance of a thermoelectric conversion module comprising the element is improved.

The present disclosure provides a novel technique to provide reduced electric resistance more surely with regard to a thermoelectric conversion element using an MgSbBiTe-type thermoelectric conversion material.

The present disclosure provides a thermoelectric conversion element comprising:
a first electrode;
a second electrode;
a first intermediate layer;
a second intermediate layer; and
a thermoelectric conversion layer,
wherein
the first intermediate layer is provided between the thermoelectric conversion layer and the first electrode;
the first intermediate layer is in contact with the thermoelectric conversion layer;
the first electrode is in contact with the first intermediate layer;
the second intermediate layer is provided between the thermoelectric conversion layer and the second electrode;
the second intermediate layer is in contact with the thermoelectric conversion layer;
the second electrode is in contact with the second intermediate layer;
the first electrode and the second electrode are composed of a CuZn alloy;
the thermoelectric conversion layer is composed of a thermoelectric conversion material containing Mg;
the thermoelectric conversion material contains at least one kind of element selected from the group consisting of Sb and Bi;
the thermoelectric conversion material contains at least one kind of element selected from the group consisting of Se and Te;
the thermoelectric conversion material has a $La_2O_3$-type crystalline structure;
a composition of the first intermediate layer is different from both a composition of the first electrode and a composition of the thermoelectric conversion layer; and
a composition of the second intermediate layer is different from both a composition of the second electrode and a composition of the thermoelectric conversion layer.

According to the present disclosure, reduced electric resistance is provided more surely with regard to a thermoelectric conversion element using an MgSbBiTe-type thermoelectric conversion material.

DETAILED DESCRIPTION OF THE EMBODIMENT (Incorporation by Reference)

Japanese patent publication No. 6127281 and United States Patent Application Publication No. 2017/0117453, which corresponds thereto, are incorporated herein by reference.

(Findings which Established the Foundation of the Present Disclosure)

According to the consideration by the present inventors, bondability in an MgSbBiTe-type thermoelectric conversion material with an electrode is affected to a large degree by Mg contained in the material. More specifically, in the MgSbBiTe-type thermoelectric conversion material, the bondability with the electrode may be decreased depending on highness of diffusivity of Mg contained in the material. In the MgAgSb-type thermoelectric conversion material disclosed in Non-Patent Literature 1, nothing was reported about influence of Mg with regard to the bondability with the electrode. According to the further consideration by the present inventors, the bondability with the electrode in the MgSbBiTe-type thermoelectric conversion material is improved with a first electrode and a second electrode, each of which is composed of a CuZn alloy, and with a first intermediate layer and a second intermediate layer. Due to the improvement of the bondability, the reduced electric resistance is provided more surely with regard to a thermoelectric conversion element using the MgSbBiTe-type thermoelectric conversion material.

EMBODIMENT OF PRESENT DISCLOSURE

Hereinafter, the embodiment of the present disclosure will be described with reference to the drawings.

(Thermoelectric Conversion Element)

Figure 1:
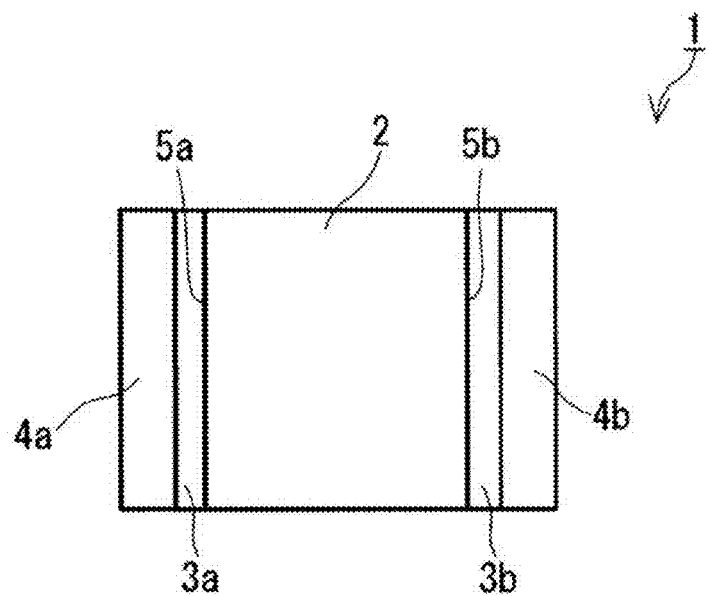
FIG. 1 is a schematic view showing one example of a thermoelectric conversion element of the present disclosure.

One example of the thermoelectric conversion element of the present disclosure is shown in FIG. 1. The thermoelectric conversion element 1 of FIG. 1 comprises a thermoelectric conversion layer 2, a first intermediate layer 3a, a second intermediate layer 3b, a first electrode 4a, and a second electrode 4b. The thermoelectric conversion layer 2 has a first surface 5a and a second surface 5b. The second surface 5b is a reverse surface of the first surface 5a. The first intermediate layer 3a is provided between the thermoelectric conversion layer 2 and the first electrode 4a. The first intermediate layer 3a is in contact with the thermoelectric conversion layer 2. The first electrode 4a is in contact with the first intermediate layer 3a. The second intermediate layer 3b is provided between the thermoelectric conversion layer 2 and the second electrode 4b. The second intermediate layer 3b is in contact with the thermoelectric conversion layer 2. The second electrode 4b is in contact with the second intermediate layer 3b.

In the element 1 of FIG. 1, the shape of the thermoelectric conversion layer 2 is rectangular parallelepiped. However, the shape of the thermoelectric conversion layer 2 is not limited to rectangular parallelepiped. In the element 1 of FIG. 1, the first surface 5a and the second surface 5b of the thermoelectric conversion layer 2 are parallel to each other. However, as long as the first surface 5a is not in contact with the second surface 5b, the first surface 5a and the second surface 5b don't have to be parallel to each other.

The thermoelectric conversion layer 2 is composed of a thermoelectric conversion material A containing Mg. The thermoelectric conversion material A contains at least one kind of element selected from the group consisting of Sb, Bi, and Te. In addition, the thermoelectric conversion material A contains at least one kind of element selected from the group consisting of Se and Te. The thermoelectric conversion material A has a $La_2O_3$—type crystalline structure.

The thermoelectric conversion material A may have a composition represented by a formula (I): $Mg_{3+m}A_aB_bD_{2-e}E_e$ and be of n-type. The element 1 comprising the thermoelectric conversion layer 2 composed of the n-type thermoelectric conversion material A is an n-type thermoelectric conversion element.

A in the formula (I) is at least one kind of element selected from the group consisting of Ca, Sr, Ba, and Yb. B is at least one kind of element selected from the group consisting of Mn and Zn. D is at least one kind of element selected from the group consisting of Sb and Bi. E is at least one kind of element selected from the group consisting of Se and Te. The value of m in the formula (I) falls within a range of not less than −0.39 and not more than 0.42. The value of a falls within a range of not less than 0 and not more than 0.12. The value of b falls within a range of not less than 0 and not more than 0.48. The value of e falls within a range of not less than 0.001 and not more than 0.06.

The value of e in the formula (I) may fall within a range of not less than 0.004 and not more than 0.020. In this case, thermoelectric conversion performance of the element 1 and a thermoelectric conversion module comprising the element 1 can be improved.

m, a, and b of the formula (I) may satisfy a formula (II): m=m'-a-b. The value of m' in the formula (II) falls within a range of not less than 0 and not more than 0.21. At least one value selected from the group consisting of values of a and b in the formula (II) is more than 0. In this case, the thermoelectric conversion performance of the element 1 and the thermoelectric conversion module comprising the element 1 can be improved.

The values of a and b in the formula (I) may be 0. In this case, the thermoelectric conversion performance of the element 1 and the thermoelectric conversion module comprising the element 1 can be improved.

D in the formula (I) may be Sb and Bi, and E may be Te. In this case, the thermoelectric conversion performance of the element 1 and the thermoelectric conversion module comprising the element 1 can be improved.

The thermoelectric conversion material A is described in Japanese Patent Publication No. 6127281 and United States Patent Application Publication No. 2017/0117453, which corresponds thereto, and may employ an arbitrary composition within the range of the formula (I).

The first electrode 4a is composed of a CuZn alloy. The second electrode 4b is composed of a CuZn alloy. The composition of the first electrode 4a and the composition of the second electrode 4b may be the same or different. The composition of the CuZn alloy falls within the range, for example, from Cu:Zn=99:1 to Cu:Zn=57:43, indicated by ratio by weight, may fall within the range from Cu:Zn=68:32 to Cu:Zn=63:37. The CuZn alloy may contain another metal element other than Cu and Zn within a range of not more than 11 weight percent. The CuZn alloy may be an alloy classified as brass. Note that the presence of impurities in the CuZn alloy is permissive, similarly to another typical alloy.

The first electrode $4a$ is joined to the first surface $5a$ so as to cover at least a part of the first surface $5a$. The first electrode $4a$ may be joined to the first surface $5a$ so as to cover the whole of the first surface $5a$. The second electrode $4b$ is joined to the second surface $5b$ so as to cover at least a part of the second surface $5b$. The second electrode $4b$ may be joined to the second surface $5b$ so as to cover the whole of the second surface $5b$.

The thickness and the shape of the first electrode $4a$ and the second electrode $4b$ are not limited.

The composition of the first intermediate layer $3a$ is different from both the composition of the first electrode $4a$ and the composition of the thermoelectric conversion layer 2 (namely, the composition of the thermoelectric conversion material A). The composition of the second intermediate layer $3b$ is different from both the composition of the second electrode $4b$ and the composition of the thermoelectric conversion layer 2. The composition of the first intermediate layer $3a$ and the composition of the second intermediate layer $3b$ may be the same or different.

The first intermediate layer $3a$ and the second intermediate layer $3b$ contain, for example, Cu, Zn, and Mg. In this case, the content of Cu is, for example, not less than 50 weight percent and not more than 70 weight percent. The content of Zn is, for example, not less than 25 weight percent and not more than 35 weight percent. The content of Mg is, for example, not less than 0.1 weight percent and not more than 25 weight percent. In a case where the first intermediate layer $3a$ and the second intermediate layer $3b$ contain Cu, Zn, and Mg, the content of Mg may be small, compared to the content of at least one kind of element selected from the group consisting of Cu and Zn. The first intermediate layer $3a$ and the second intermediate layer $3b$ may contain an element (Mg is excluded) which constitutes the thermoelectric conversion material A. However, in this case, the contents of these elements in the first intermediate layer $3a$ and the second intermediate layer $3b$ are generally smaller than the content of Mg. The first intermediate layer $3a$ and the second intermediate layer $3b$ do not have to contain the element (Mg is excluded) which constitutes the thermoelectric conversion material A.

The first intermediate layer $3a$ is disposed between the first surface $5a$ and the first electrode $4a$ so as to cover at least a part of the first surface $5a$. The first intermediate layer $3a$ may be disposed between the first surface $5a$ and the first electrode $4a$ so as to cover the whole of the first surface $5a$. The second intermediate layer $3b$ is disposed between the second surface $5b$ and the second electrode $4b$ so as to cover at least a part of the second surface $5b$. The second intermediate layer $3b$ may be disposed between the second surface $5b$ and the second electrode $4b$ so as to cover the whole of the second surface $5b$.

The thickness of the first intermediate layer $3a$ and the second intermediate layer $3b$ is, for example, not less than 0.1 micrometer and not more than 300 micrometers, may be not less than 3 micrometers and not more than 30 micrometers. The thickness of the first intermediate layer $3a$ and the thickness of the second intermediate layer $3b$ may be the same or different.

The shape of the first intermediate layer $3a$ and the second intermediate layer $3b$ is not limited.

The thermoelectric conversion element of the present disclosure may comprise at least one selected from the group consisting of another layer and member other than the above.

The use of the thermoelectric conversion element of the present disclosure is not limited. The use is, for example, a thermoelectric conversion module.

(Fabrication Method)

One example of a method for fabricating the thermoelectric conversion element of the present disclosure will be described below. However, the method for fabricating the thermoelectric conversion element of the present disclosure is not limited to the following example(s).

First, the thermoelectric conversion layer 2 composed of the thermoelectric conversion material A is fabricated. The fabrication method of the thermoelectric conversion layer 2 is, for example, a method described in Japanese Patent Publication No. 6127281 and United States Patent Application Publication No. 2017/0117453, which corresponds thereto.

Next, the CuZn alloy layers are formed on the first surface $5a$ and the second surface $5b$ of the fabricated thermoelectric conversion layer 2. For the formation of the CuZn alloy layer, for example, a spark plasma sintering method (hereinafter, referred to as "SPS method") may be used. However, the method for forming the CuZn alloy layer is not limited to the SPS method. In the formation process of the CuZn alloy layer, the first intermediate layer $3a$, the second intermediate layer $3b$, the first electrode $4a$, and the second electrode $4b$ are formed. It is presumed that the diffusion of Mg from the thermoelectric conversion layer 2 is associated with the formation of these layers and members. In light of the diffusion of Mg, for example, temperature from 400 to approximately 800 degrees Celsius is used in the formation of the CuZn alloy layer on the basis of various methods including the SPS method.

(Thermoelectric Conversion Module)

Figure 2:
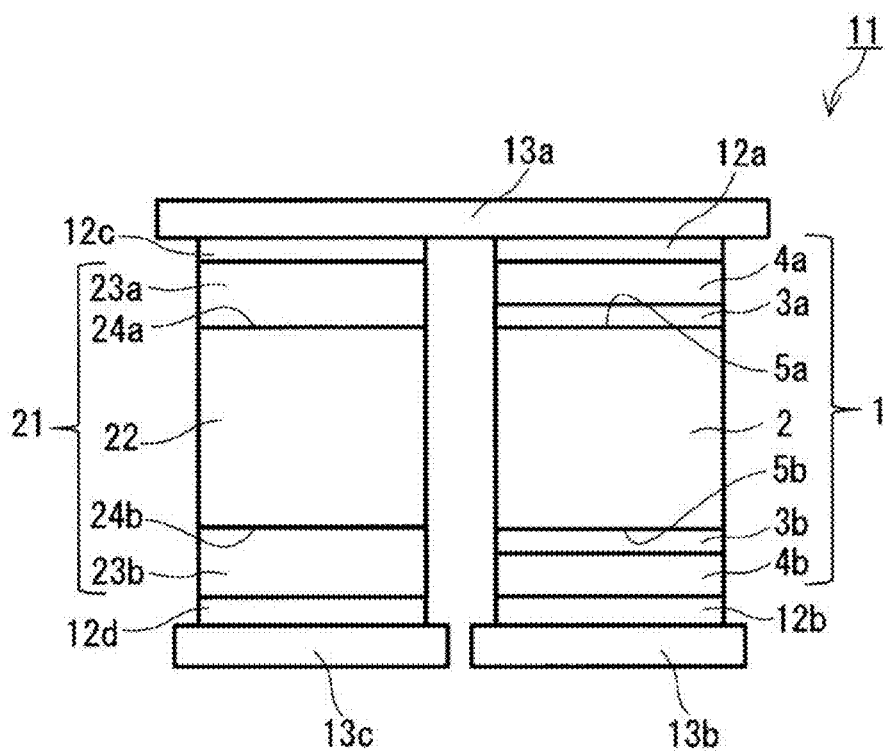
FIG. 2 is a schematic view showing one example of a thermoelectric conversion module of the present disclosure.

One example of the thermoelectric conversion module of the present disclosure is shown in FIG. 2. The thermoelectric conversion module 11 of FIG. 2 comprises the n-type thermoelectric conversion element 1 and a p-type thermoelectric conversion element 21.

The n-type thermoelectric conversion element 1 comprises the first electrode $4a$, the second electrode $4b$, the first intermediate layer $3a$, the second intermediate layer $3b$, and the thermoelectric conversion layer 2 which is an n-type thermoelectric conversion part. The n-type thermoelectric conversion part comprises the first surface $5a$ and the second surface $5b$. The second surface $5b$ is a reverse surface of the first surface $5a$. The first intermediate layer $3a$ is provided between the n-type thermoelectric conversion part and the first electrode $4a$. The first intermediate layer $3a$ is in contact with the n-type thermoelectric conversion part. The first electrode $4a$ is in contact with the first intermediate layer $3a$. The second intermediate layer $3b$ is provided between the n-type thermoelectric conversion part and the second electrode $4b$. The second intermediate layer $3b$ is in contact with the n-type thermoelectric conversion part. The second electrode $4b$ is in contact with the second intermediate layer $3b$.

The p-type thermoelectric conversion element 21 comprises a third electrode $23a$, a fourth electrode $23b$, and a p-type thermoelectric conversion part 22. The p-type thermoelectric conversion part 22 has a third surface $24a$ and a fourth surface $24b$. The fourth surface $24b$ is a reverse surface of the third surface $24a$. The p-type thermoelectric conversion part 22 is provided between the third electrode $23a$ and the fourth electrode $23b$. The third electrode $23a$ and the fourth electrode 23b are in contact with the p-type thermoelectric conversion part 22.

One electrode in the n-type thermoelectric conversion element 1 and one electrode in the p-type thermoelectric conversion element 21 are electrically connected to each other. In the example of FIG. 2, the first electrode 4a of the n-type thermoelectric conversion element 1 and the third electrode 23a of the p-type thermoelectric conversion element 21 are electrically connected to each other via a first external electrode 13a. A joint layer 12a having conductivity is disposed between the first electrode 4a and the first external electrode 13a. A joint layer 12c having conductivity is disposed between the third electrode 23a and the first external electrode 13a. In addition, the second electrode 4b, which is the other electrode of the n-type thermoelectric conversion element 1, is electrically connected to a second external electrode 13b via a joint layer 12b having conductivity. The fourth electrode 23b, which is the other electrode of the p-type thermoelectric conversion element 21, is electrically connected to a third external electrode 13c via a joint layer 12d having conductivity. In the thermoelectric conversion module 11, outside extraction of electric power is allowed via the second external electrode 13b and the third external electrode 13c.

A known element can be used for the p-type thermoelectric conversion element 21.

The configurations of the joint layers 12a, 12b, 12c, and 12d are not limited, as long as the joint layers 12a, 12b, 12c, and 12d have conductivity.

A known external electrode may be used for the first external electrode 13a, the second external electrode 13b, and the third external electrode 13c.

The thermoelectric conversion module 11 can be fabricated by a known method.

The use of the thermoelectric conversion module of the present disclosure is not limited. The thermoelectric conversion module of the present disclosure can be used, for example, for various uses including use of a conventional thermoelectric conversion module.

EXAMPLES

Hereinafter, the thermoelectric conversion element of the present disclosure will be described in more detail with reference to the examples. However, the thermoelectric conversion element of the present disclosure is not limited to each of the aspects shown in the following examples.

Inventive Example 1

(Fabrication of Sintered Body)
A sintered body composed of the thermoelectric conversion material A was fabricated as below. The composition of the thermoelectric conversion material A was $Mg_{3.08}Sb_{1.49}Bi_{0.49}Te_{0.02}$.

First, granular antimony (5.48 grams, 0.045 mol) and granular bismuth (3.01 grams, 0.0144 mol) were melted by an arc melting method at temperature of the range from 1,000 to 1,500 degrees Celsius. In this way, an alloy of antimony (Sb) and bismuth (Bi) was provided. Next, the provided alloy was ground in a mortar to form powder of SbBi.

Next, magnesium powder (2.33 grams, 0.096 mol) and tellurium powder (0.0474 grams, 0.0006 mol) were added to the powder of SbBi. Subsequently, these powders were mixed sufficiently. A molar ratio of Mg, Sb, Bi, and Te as starting materials was Mg:Sb:Bi:Te=0.096:0.045:0.0144:0.0006, namely, 3.20:1.50:0.48:0.02.

Next, the mixed powders were supplied to a tableting machine to form a tablet. Next, the tablet was put into a carbon crucible. The carbon crucible was filled with an argon gas. Next, the tablet was heated at temperature of the range of 800-1,000 degrees Celsius for ten seconds. The tablet was melted by the heat to form an ingot.

Next, the ingot was put in a mortar disposed in a globe box filled with an argon gas. The ingot was ground in the mortar to form powder of MgSbBiTe. The formed powder had a particle size of not more than 100 micrometers.

Next, the MgSbBiTe powder was sintered by a SPS method to form a sintered body. The sintering by the SPS method was performed as below. First, a cylindrical die (i.e. a sintering die) made of graphite was filled with the MgSbBiTe powder. The die had an external diameter of 50 millimeters and an inner diameter of 10 millimeters. The filling was performed in a globe box filled with an argon gas. Next, the die was loaded into a chamber of a spark plasma sintering device. The chamber was controlled to an argon atmosphere. Next, while a pressure of 50 MPa was applied to the powder with which the die was filled, a pulse electric current was applied to the die with the sintering device. Temperature rising of 20 degrees Celsius/minute was achieved by the application of the electric current. After the temperature of the die reached 600 degrees Celsius which was a sintering temperature, the temperature was maintained for 30 minutes. Next, the heat of the die was stopped by stopping the electric current. After the temperature of the die lowered to room temperature, a cylindrical sintered body was picked up from the die.

Figure 3:
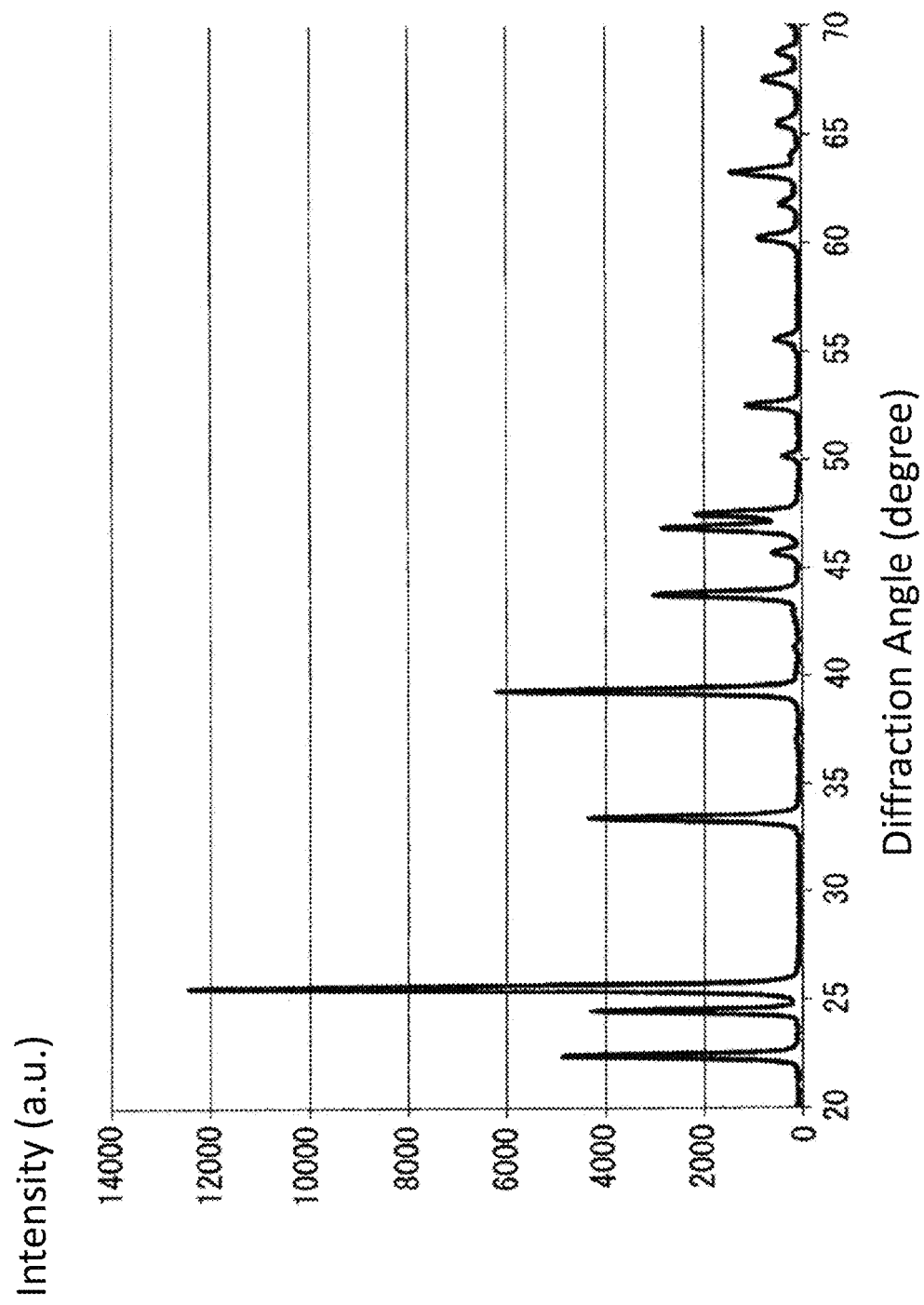
FIG. 3 is a graph showing an X-ray diffraction profile of the thermoelectric conversion material fabricated in the inventive example 1.

It was confirmed that the thermoelectric conversion material A which constituted the sintered body had a $La_2O_3$-type crystalline structure by the evaluation on the basis of an X-ray diffraction measurement. The X-ray diffraction profile of the thermoelectric conversion material A provided by the X-ray diffraction measurement is shown in FIG. 3. Note that a CuKα ray was used for the X-ray diffraction measurement.

Figure 4:
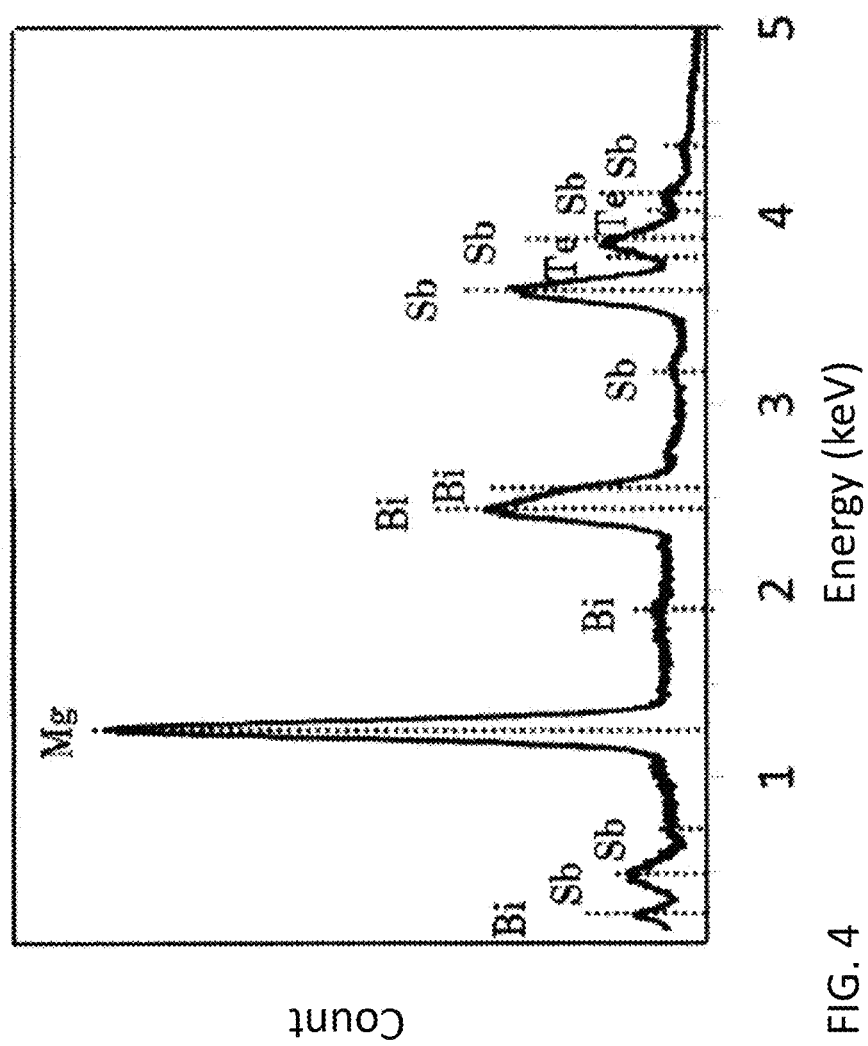
FIG. 4 is a graph showing an energy dispersive X-ray analysis (hereinafter, referred to as "EDX") spectrum of the thermoelectric conversion material fabricated in the inventive example 1.

It was confirmed that the composition of the thermoelectric conversion material A which constituted the sintered body was $Mg_{3.08}Sb_{1.49}Bi_{0.49}Te_{0.02}$ by the evaluation on the basis of EDX. The EDX spectrum of the thermoelectric conversion material A is shown in FIG. 4. An energy dispersive X-ray spectrometer for SEM (product of Bruker Corporation, XFlash6|10) was used for EDX. A field emission-type SEM (FE-SEM; product of Hitachi High-Technologies Corporation, SU8220) was used for SEM combined with the above spectrometer.

(Formation of CuZn Alloy Layer)
The upper and lower surfaces of the cylindrical sintered body were polished with a sand paper of #400. The polishing was performed in a globe box filled with an argon gas. The height of the polished sintered body was 3.5 millimeters.

Next, CuZn alloy layers were formed on an upper surface (first surface) and a lower surface (second surface) of the sintered body by a SPS method. The formation of the CuZn alloy layers by the SPS method was performed as below.

First, the polished sintered body was put into the cylindrical die used for the fabrication of the sintered body. Next, 0.336 grams of the CuZn powder was supplied from an upper surface in a condition where the die stood upright. The CuZn powder was deposited on the first surface of the sintered body put in the die. Next, a pressure was applied lightly to the deposited CuZn powder. Next, the die was inverted to interchange the upper surface and the lower surface of the die. Next, in a condition where the die stood upright, 0.336 grams of the CuZn powder was supplied from the upper surface which had been interchanged. The CuZn powder was deposited on the second surface of the sintered body put in the die. Next, a pressure was applied lightly to the deposited CuZn powder. The composition of the alloy which constituted the CuZn powder was Cu:Zn=65:35 (weight ratio). The putting of the sintered body into the die and the supplying of the CuZn powder into the die were performed in the globe box filled with an argon gas.

Next, the die was loaded into the chamber of the spark plasma sintering device. The chamber was controlled to an argon atmosphere. Next, while a pressure of 90 MPa was applied to the sintered body and the CuZn powder with which the die was filled, a pulse electric current was applied to the die with the sintering device. The temperature rising of 60 degrees Celsius/minute was achieved by the application of the electric current. After the temperature of the die reached 600 degrees Celsius which was a sintering temperature, the temperature was maintained for 15 minutes. Next, the heat of the die was stopped by stopping the electric current. After the temperature of the die lowered to room temperature, a cylindrical sintered body having the CuZn alloy layers on the upper and lower surfaces thereof was picked up from the die.

Next, the surfaces of the CuZn alloy layers in the picked sintered body were polished with a sand paper of #400. The polishing was performed in a globe box filled with an argon gas. The height of the polished sintered body was 4.0 millimeters. Next, the polished sintered body was cut with a dicer to form a rectangular-parallelepiped thermoelectric conversion element having a size of a width of 3.5 millimeters, a depth of 3.5 millimeters, and a height of 4.0 millimeters.

Figure 5A:
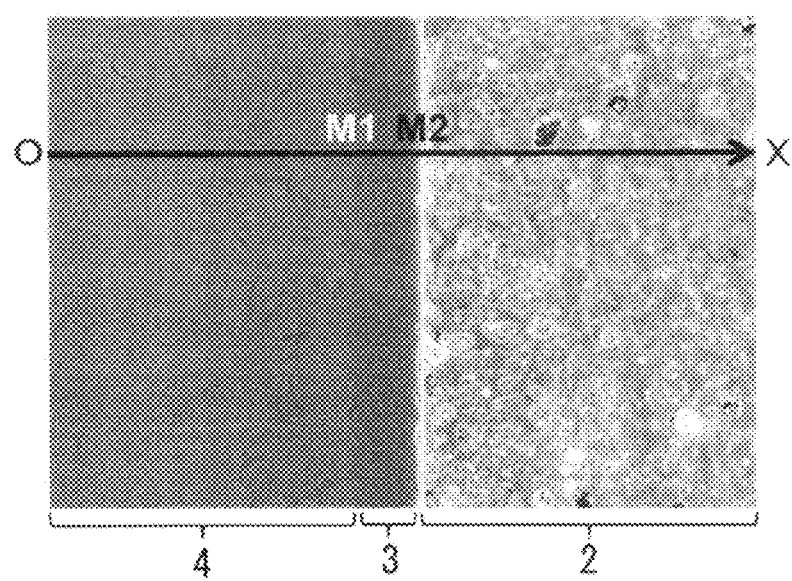
FIG. 5A is an observation image provided using a scanning electron microscope (hereinafter, referred to as "SEM") with regard of a cross section of the thermoelectric conversion element fabricated in the inventive example 1.
Figure 5B:
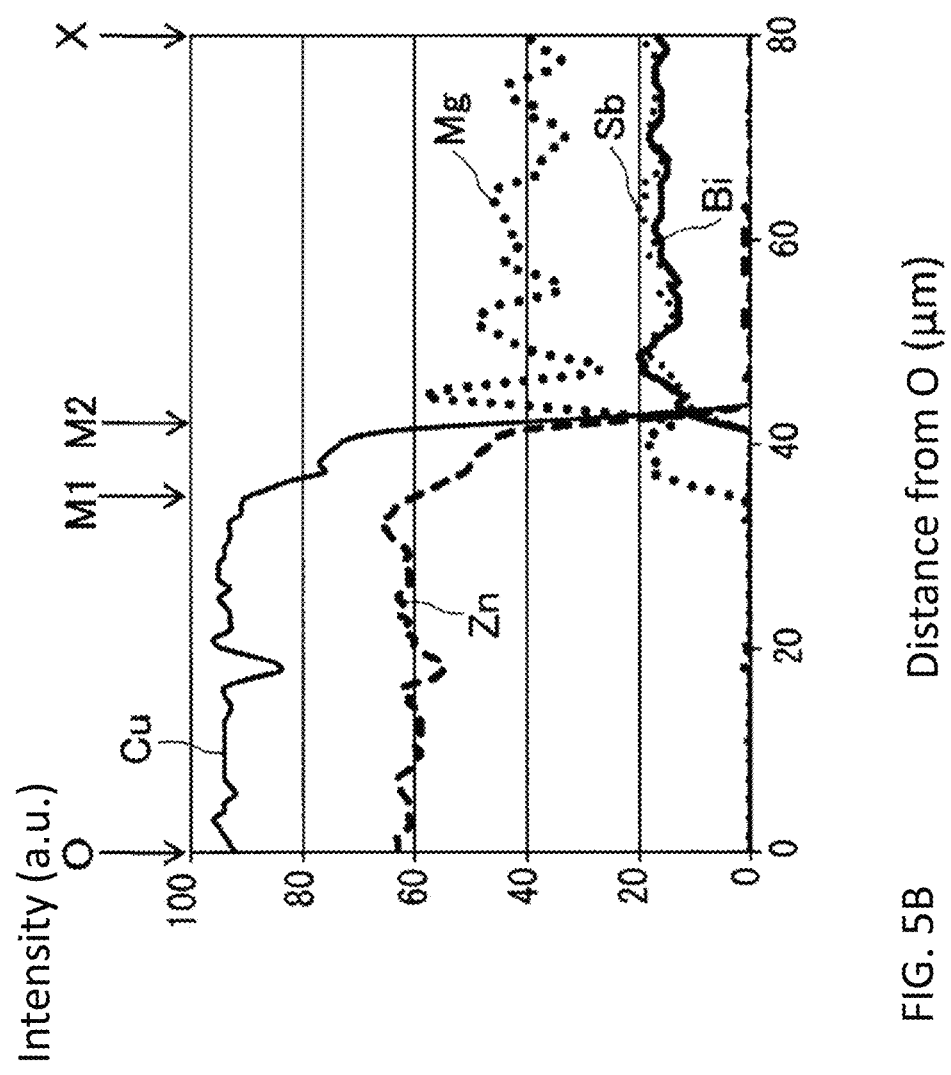
FIG. 5B is a graph showing results of linear analysis with the EDX with regard to the cross-section shown in FIG. 5A.

A state of a part which was in a cross section of the formed thermoelectric conversion element and was located near an interface between the sintered body and the CuZn alloy layer was evaluated with the SEM. In addition, the composition of the part located near an interface between the sintered body and the CuZn alloy layer was evaluated by linear analysis of the above-mentioned cross section using the EDX. The observation image with the SEM with regard of the part located near the above-mentioned interface in the cross section is shown in FIG. 5A. The results of the linear analysis with the EDX with regard to the part are shown in FIG. 5B. The linear analysis using the EDX was performed along the linear segment OX of the observation image shown in FIG. 5A. The change of the composition based on the distance from the point O in the linear segment OX is shown in FIG. 5B. The above-mentioned devices were used for the SEM and the EDX.

As shown in FIG. 5A and FIG. 5B, two boundaries M1 and M2 near which the composition is greatly changed were confirmed near the interface between the sintered body and the CuZn alloy layer. A part located between the point O and the boundary M1 was composed of Cu and Zn, namely, was a CuZn alloy layer which served as an electrode 4. A part located between the boundary M2 and the point X was composed of Mg, Sb, Bi, and Te, namely, was a thermoelectric conversion layer 2 which served as the thermoelectric conversion part. Note that a plot which corresponds to Te is not drawn clearly in FIG. 5B due to small content. On the other hand, a part located between the boundaries M1 and M2 was composed of Cu, Zn, and Mg, and was a layer having a composition different from the electrode 4 and the sintered body 2. In other words, the formation of an intermediate layer 3 containing Cu, Zn, and Mg was confirmed between the electrode 4 and the thermoelectric conversion layer 2. As shown in FIG. 5A, all of the electrode 4, the intermediate layer 3, and the thermoelectric conversion layer 2 were dense layers.

Next, an electric resistance value between a pair of the CuZn alloy layers in the formed thermoelectric conversion element was measured by a four-terminal method. A source meter (product of Toyo Corporation, Keithley 2400) was used for the measurement. The measured electric resistance value was 16.4 mega ohms. In addition, an electric resistance rate p provided on the basis of the following formula from the measured electric resistance value was 50.2 µΩ·m.

$$\rho = R \times A/L \qquad \text{Formula:}$$

R of the above formula is the resistance value between the CuZn alloy layers, A is a cross-sectional area of the thermoelectric conversion element (3.5 millimeters×3.5 millimeters), and L is a height of the thermoelectric conversion element (4.0 millimeters).

Inventive Example 2

The thermoelectric conversion element was fabricated similarly to the inventive example 1, except that the sintering temperature at which the sintered body was formed was changed to be 500 degrees Celsius, and that the sintering time was 15 minutes. By the evaluation based on the X-ray diffraction measurement, it was confirmed that the thermoelectric conversion material A which constituted the sintered body had a $La_2O_3$-type crystalline structure. In addition, by the evaluation based on the EDX, it was confirmed that the composition of the thermoelectric conversion material A which constituted the sintered body was $Mg_{3.08}Sb_{1.49}Bi_{0.49}Te_{0.02}$, which is identical to that of the inventive example 1.

Figure 6A:
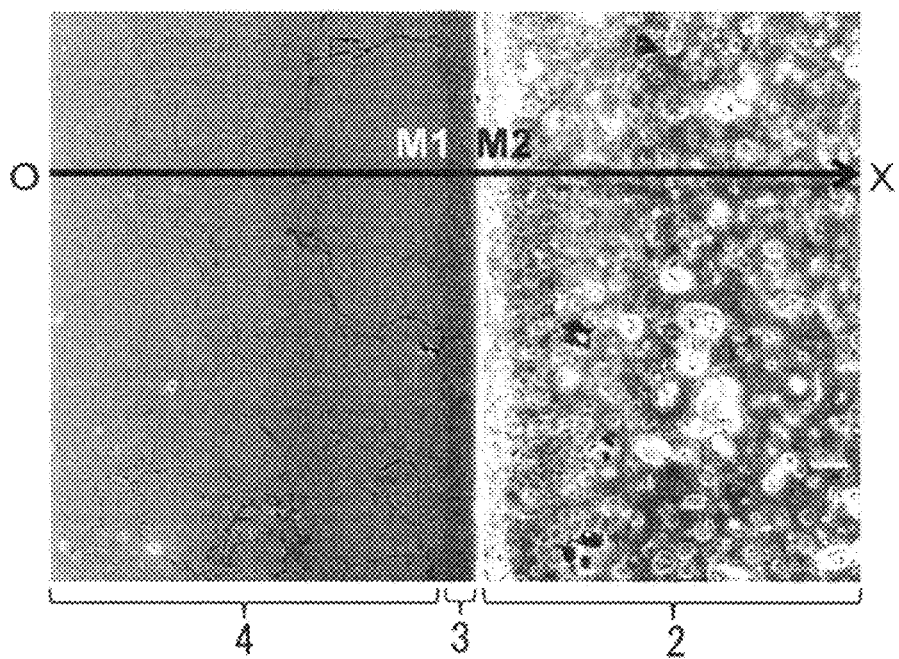
FIG. 6A is an observation image provided using the SEM with regard of a cross section of the thermoelectric conversion element fabricated in the inventive example 2.
Figure 6B:
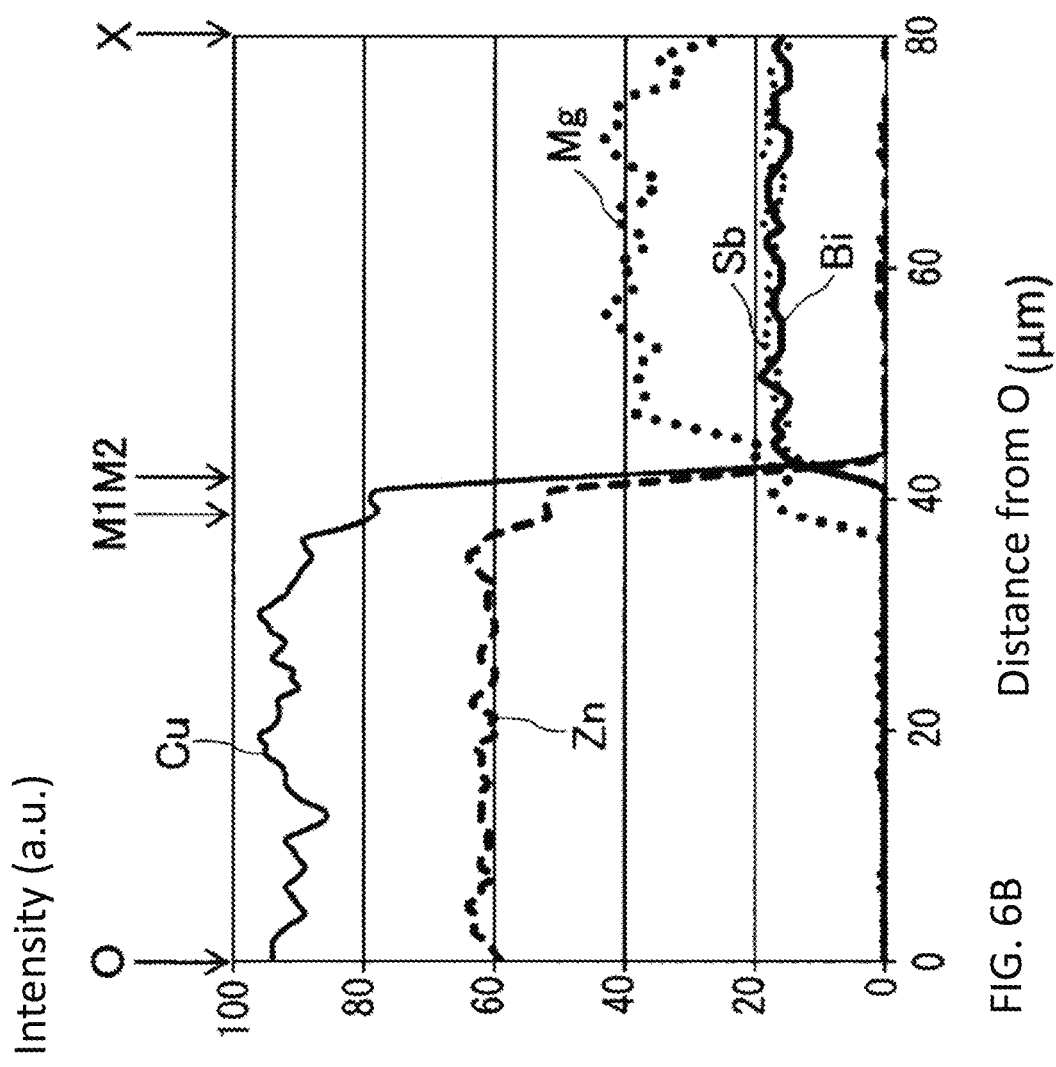
FIG. 6B is a graph showing results of linear analysis with the EDX with regard to the cross-section shown in FIG. 6A.

Similarly to the inventive example 1, a state of the part which was in a cross section of the formed thermoelectric conversion element and was located near an interface between the sintered body and the CuZn alloy layer was evaluated with the SEM. In addition, the composition of the part located near the interface between the sintered body and the CuZn alloy layer was evaluated by linear analysis of the above-mentioned cross section using the EDX. The observation image with the SEM with regard of the part located near the above-mentioned interface in the cross section is shown in FIG. 6A. The results of the linear analysis with the EDX with regard to the part are shown in FIG. 6B. The linear analysis using the EDX was performed along the linear segment OX of the observation image shown in FIG. 6A. The change of the composition based on the distance from the point O in the linear segment OX is shown in FIG. 6B.

As shown in FIG. 6A and FIG. 6B, two boundaries M1 and M2 near which the composition is greatly changed were confirmed near the interface between the sintered body and the CuZn alloy layer. A part located between the point O and the boundary M1 was composed of Cu and Zn, namely, was a CuZn alloy layer which served as the electrode 4. A part located between the boundary M2 and the point X was composed of Mg, Sb, Bi, and Te, namely, was a thermoelectric conversion layer 2 which served as the thermoelectric conversion part. Note that a plot which corresponds to Te is not drawn clearly in FIG. 6B due to small content. On the other hand, a part located between the boundaries M1 and M2 was composed of Cu, Zn, and Mg, and was a layer having a composition different from the electrode 4 and the sintered body 2. In other words, the formation of the intermediate layer 3 containing Cu, Zn, and Mg was confirmed between the electrode 4 and the thermoelectric conversion layer 2. As shown in FIG. 6A, all of the electrode 4, the intermediate layer 3, and the thermoelectric conversion layer 2 were dense layers.

Next, the electric resistance value and the electric resistance rate ρ between a pair of the CuZn alloy layers in the formed thermoelectric conversion element were measured similarly to the inventive example 1. The measured electric resistance value was 7.05 mega ohms. In addition, the measured electric resistance rate ρ was 21.6 μΩ·m.

Comparative Example 1

The upper and lower surfaces of the cylindrical sintered body fabricated similarly to the inventive example 1 were polished with a sand paper of #400. The polishing was performed in the atmosphere. The height of the polished sintered body was 0.7 millimeters. Next, Ni layers were formed on the upper surface (first surface) and the lower surface (second surface) of the sintered body by an electroplating. The thickness of each of the formed Ni layers was approximately 5 micrometers. Next, the sintered body having the Ni layers was cut with a dicer to form a rectangular-parallelepiped thermoelectric conversion element having a size of a width of 1.0 millimeter, a depth of 1.0 millimeter, and a height of 0.71 millimeters.

Figure 7A:
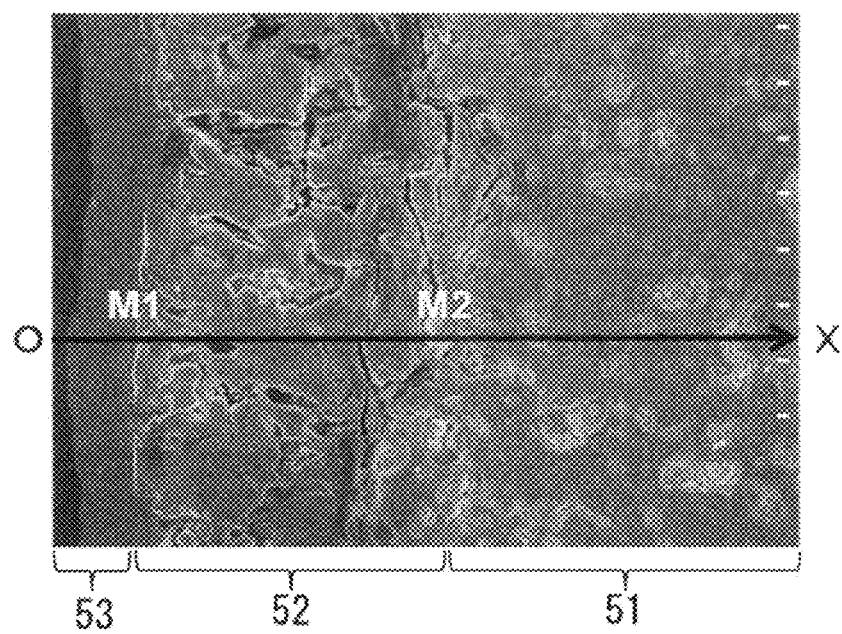
FIG. 7A is an observation image provided using the SEM with regard of a cross section of the thermoelectric conversion element fabricated in the comparative example 1.
Figure 7B:
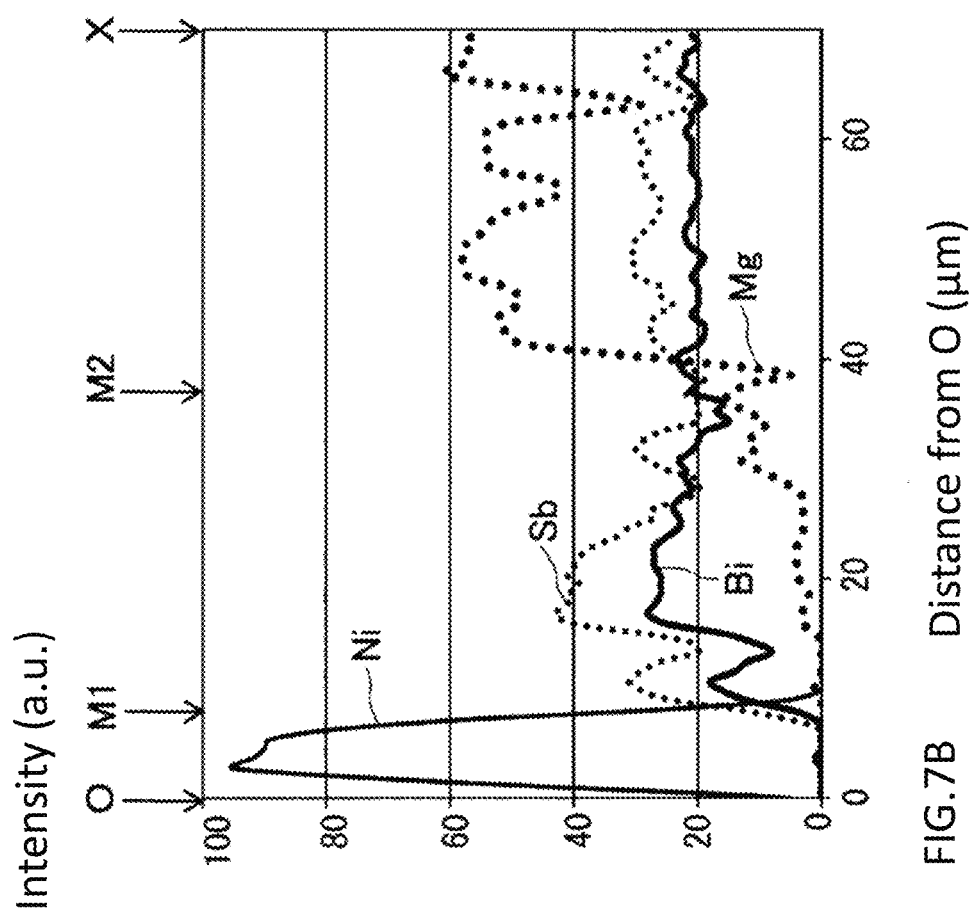
FIG. 7B is a graph showing results of linear analysis with the EDX with regard to the cross-section shown in FIG. 7A.

A state of the part which was in a cross section of the formed thermoelectric conversion element and was located near an interface between the sintered body and the Ni layer was evaluated with the SEM. In addition, the composition of the part located near the interface between the sintered body and the Ni layer was evaluated by linear analysis of the above-mentioned cross section using the EDX. The observation image with the SEM with regard of the part located near the above-mentioned interface in the cross section is shown in FIG. 7A. The results of the linear analysis with the EDX with regard to the part are shown in FIG. 7B. The linear analysis using the EDX was performed along the linear segment OX of the observation image shown in FIG. 7A. The change of the composition based on the distance from the point O in the linear segment OX is shown in FIG. 7B.

As shown in FIG. 7A and FIG. 7B, two boundaries M1 and M2 near which the composition is greatly changed were confirmed near the interface between the sintered body and the Ni layer. A part located between the point O and the boundary M1 was composed of Ni, namely, was a Ni layer which served as an electrode 53. A part located between the boundary M2 and the point X was composed of Mg, Sb, Bi, and Te, namely, was a thermoelectric conversion layer 51 which served as the thermoelectric conversion part. Note that a plot which corresponds to Te is not drawn clearly in FIG. 7B due to small content. On the other hand, the part located between the boundaries M1 and M2 was composed of Mg, Sb, Bi, and Te similarly to the thermoelectric conversion layer 51, however, was a transformation layer 52 having a composition completely different from the thermoelectric conversion layer 51. More specifically, in the transformation layer 52, the content of the Mg was significantly lowered, compared to the thermoelectric conversion layer 51. In addition, as shown in FIG. 7A, many interspaces were confirmed in the transformation layer 52. From the consideration of the composition and the formation of the interspaces, it is presumed that the transformation layer 52 was formed due to the diffusion and the outflow of Mg from the thermoelectric conversion layer 51 near the interface.

Next, the electric resistance value and the electric resistance rate ρ between a pair of the Ni layers in the formed thermoelectric conversion element were measured similarly to the inventive example 1. In the calculation of the electric resistance rate ρ, R in the above-mentioned formula was an electric resistance value between the Ni layers, A was the cross-sectional area of the thermoelectric conversion element (1.0 millimeter×1.0 millimeter), and L was the height of the thermoelectric conversion element (0.71 millimeters). The measured electric resistance value was 841 mega ohms. In addition, the provided electric resistance rate ρ was 1,185 μΩ·m.

The electric resistance values and the electric resistance rate ρ between the electrodes in the thermoelectric conversion element of the inventive examples 1 and 2 and the comparative example 1 are summarized in the following Table 1.

TABLE 1

|  | Resistance value (μΩ) | Resistance Rate (μΩ·m) |
|---|---|---|
| Inventive Example 1 | 16.4 | 50.2 |
| Inventive Example 2 | 7.05 | 21.6 |
| Comparative Example 1 | 841 | 1,185 |

As shown in Table 1, in the thermoelectric conversion elements of the inventive examples 1 and 2, the electric resistance was significantly lowered, compared to the thermoelectric conversion element of the comparative example 1.

INDUSTRIAL APPLICABILITY

The thermoelectric conversion element of the present disclosure can be used for various uses including use of conventional thermoelectric conversion elements.

REFERENTIAL SIGNS LIST

1 (n-type) Thermoelectric conversion element
2 Thermoelectric conversion layer
3 Intermediate layer
3a First intermediate layer
3b Second intermediate layer
4 Electrode
4a First electrode
4b Second electrode
5a First surface
5b Second surface
11 Thermoelectric conversion module
12a, 12b, 12c, 12d Joint layer
13a First external electrode
13b Second external electrode
13c Third external electrode
21 p-type thermoelectric conversion element
22 p-type thermoelectric conversion part
23a Third electrode
23b Fourth electrode
24a Third surface
24b Fourth surface
51 Thermoelectric conversion layer
52 Transformation layer
53 Ni layer

The invention claimed is:

1. A fabrication method of a thermoelectric conversion element, the method comprising:

forming a first metal layer containing Cu and Zn on a first surface of a thermoelectric conversion layer;

forming a second metal layer containing Cu and Zn on a second surface of the thermoelectric conversion layer, the second surface being opposite to the first surface; and subsequently heating the thermoelectric conversion layer, the first metal layer, and the second metal layer at a temperature of 400° C. to 800° C. to form, from the first metal layer, a first electrode and a first intermediate layer provided between the thermoelectric conversion layer and the first electrode, and to form, from the second metal layer, a second electrode and a second intermediate layer provided between the thermoelectric conversion layer and the second electrode;

wherein the thermoelectric conversion layer is composed of a thermoelectric conversion material containing Mg and at least one kind of element selected from the group consisting of Sb and Bi, the first intermediate layer is in contact with the thermoelectric conversion layer, the first intermediate layer contains Mg and the Mg contained in the first intermediate layer is diffused from the thermoelectric conversion layer, the first electrode is in contact with the first intermediate layer, a composition of the first intermediate layer is different from both a composition of the first electrode and a composition of the thermoelectric conversion layer, the second intermediate layer is in contact with the thermoelectric conversion layer, the second electrode is in contact with the second intermediate layer, and a composition of the second intermediate layer is different from both a composition of the second electrode and a composition of the thermoelectric conversion layer.

2. The fabrication method of the thermoelectric conversion element according to claim 1, wherein the first intermediate layer contains Cu and Mg.

3. The fabrication method of the thermoelectric conversion element according to claim 1, wherein a content of Cu in the first intermediate layer is not less than 50 weight percent, and a content of Mg in the first intermediate layer is smaller than the content of Cu in the first intermediate layer.

4. The fabrication method of the thermoelectric conversion element according to claim 1, wherein the first intermediate layer is in direct contact with the thermoelectric conversion layer.

5. The fabrication method of the thermoelectric conversion element according to claim 1, wherein the second intermediate layer contains Mg and the Mg contained in the second intermediate layer is diffused from the thermoelectric conversion layer.

6. The fabrication method of the thermoelectric conversion element according to claim 2, wherein the second intermediate layer is in direct contact with the thermoelectric conversion layer.

* * * * *